United States Patent
Ishimori et al.

(10) Patent No.: US 8,960,867 B2
(45) Date of Patent: Feb. 24, 2015

(54) ELECTROMECHANICAL CONVERSION ELEMENT, MANUFACTURING METHOD THEREOF, PIEZOELECTRIC TYPE ACTUATOR, LIQUID DROPLET JETTING HEAD, AND INKJET RECORDING APPARATUS

(71) Applicants: Masahiro Ishimori, Tokyo (JP); Masaru Shinkai, Kanagawa (JP); Satoshi Mizukami, Kanagawa (JP); Takahiko Kuroda, Hyogo (JP)

(72) Inventors: Masahiro Ishimori, Tokyo (JP); Masaru Shinkai, Kanagawa (JP); Satoshi Mizukami, Kanagawa (JP); Takahiko Kuroda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/848,243

(22) Filed: Mar. 21, 2013

(65) Prior Publication Data
US 2013/0250009 A1 Sep. 26, 2013

(30) Foreign Application Priority Data

Mar. 23, 2012 (JP) ................................ 2012-067545

(51) Int. Cl.
- *B41J 2/045* (2006.01)
- *H01L 41/00* (2013.01)
- *H02N 2/00* (2006.01)
- *H01L 41/08* (2006.01)
- *H01L 41/09* (2006.01)
- *H01L 41/047* (2006.01)
- *H01L 41/29* (2013.01)
- *H01L 41/318* (2013.01)
- *B41J 2/14* (2006.01)
- *B41J 2/16* (2006.01)

(52) U.S. Cl.
CPC ........ *H01L 41/0805* (2013.01); *H01L 41/0973* (2013.01); *B41J 2/045* (2013.01); *H01L 41/0478* (2013.01); *H01L 41/0815* (2013.01); *H01L 41/29* (2013.01); *H01L 41/318* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1632* (2013.01); *B41J 2/1642* (2013.01); *B41J 2/1645* (2013.01); *B41J 2/1646* (2013.01)
USPC ........................................... 347/68; 310/311

(58) Field of Classification Search
None
See application file for complete search history.

(56) References Cited

U.S. PATENT DOCUMENTS

| | | | |
|---|---|---|---|
| 5,265,315 A * | 11/1993 | Hoisington et al. | ......... 29/25.35 |
| 5,933,167 A | 8/1999 | Shimada et al. | |
| 6,599,757 B1 | 7/2003 | Murai | |
| 2006/0012644 A1 * | 1/2006 | Yasui | .............................. 347/68 |
| 2011/0143146 A1 * | 6/2011 | Harigai et al. | ................ 428/446 |

FOREIGN PATENT DOCUMENTS

| | | |
|---|---|---|
| JP | 3517876 | 4/2004 |
| JP | 2004-186646 | 7/2004 |
| JP | 3541877 | 7/2004 |
| JP | 3576788 | 10/2004 |
| JP | 3582550 | 10/2004 |
| JP | 3734176 | 1/2006 |
| JP | 4050004 | 2/2008 |

* cited by examiner

*Primary Examiner* — Matthew Luu
*Assistant Examiner* — Erica Lin
(74) *Attorney, Agent, or Firm* — Cooper & Dunham LLP (57) ABSTRACT

An electromechanical conversion element for converting an electric signal into mechanical displacement or converting mechanical displacement into an electric signal, includes a bottom electrode in which an alumina film, a metal film, and a conductive oxide film are sequentially laminated; an electromechanical conversion film disposed on the conductive oxide film of the bottom electrode; and a top electrode disposed on the electromechanical conversion film, wherein the metal film is solid.

11 Claims, 6 Drawing Sheets

ELECTROMECHANICAL CONVERSION ELEMENT, MANUFACTURING METHOD THEREOF, PIEZOELECTRIC TYPE ACTUATOR, LIQUID DROPLET JETTING HEAD, AND INKJET RECORDING APPARATUS

BACKGROUND OF THE INVENTION

1. Field of the Invention

The present invention relates to an electromechanical conversion element, a manufacturing method thereof, a piezoelectric type actuator, a liquid droplet jetting head, and an inkjet recording apparatus.

2. Description of the Related Art

In relation to an inkjet recording apparatus and a liquid droplet jetting head used as an image recording apparatus or an image forming apparatus such as a printer, a fax machine, and a copier, there is known a device with a nozzle for jetting ink droplets, a pressure chamber to which the nozzle is connected, and an electromechanical conversion element such as a piezoelectric element for applying pressure to the ink inside the pressure chamber.

For example, the electromechanical conversion element has a structure in which an electromechanical conversion film is disposed between a bottom electrode and a top electrode. The conventional technology discloses a method of forming an electromechanical conversion film with good crystalline orientation properties. Specifically, a noble metal electrode including titanium on which the titanium has been deposited in island shapes on the surface is used as the bottom electrode, and an electromechanical conversion film is formed on this metal electrode. Furthermore, there are cases where a platinum film and a conductive oxide film are sequentially formed on a titanium film by a sputtering method to form the bottom electrode, and a film made of lead zirconate titanate (PZT) is formed as an electromechanical conversion film on the conductive oxide film.

However, when forming a platinum film and a conductive oxide film on a titanium film by a sputtering method, the temperature needs to be high. Therefore, the titanium diffuses in the platinum film, and holes are formed in the platinum film.

If holes are formed in the platinum film, the continuity of the conductive oxide crystal in the conductive oxide film is hampered by the holes. Therefore, it becomes difficult to make the conductive oxide film have a higher average particle diameter than the platinum film, and the surface of the conductive oxide film becomes rough. As a result, an electromechanical conversion having good crystalline orientation properties cannot be formed.

Furthermore, the lead component of PZT constituting the electromechanical conversion film excessively diffuses on the rough parts of the surface of the conductive oxide film and in the holes in the platinum layer. Thus, a leak path is formed and electric field concentration occurs, and the withstand voltage of the electromechanical conversion element decreases.

By increasing the thickness of the platinum film, holes can be eliminated. However, this is not desirable because increasing the thickness of the platinum film, which is an expensive metal, incurs an increase in cost. Similarly, by reducing the thickness of the titanium film, it is possible to reduce the amount of titanium diffusing in the platinum film. However, if the thickness of the titanium film is excessively reduced, the adhesion between the platinum film and the vibrating plate on which the titanium film is formed is deteriorated, and peeling occurs in the bottom electrode.

Patent Document 1: Japanese Laid-Open Patent Publication No. 2004-186646

SUMMARY OF THE INVENTION

The present invention provides an electromechanical conversion element, a manufacturing method thereof, a piezoelectric type actuator, a liquid droplet jetting head, and an inkjet recording apparatus, in which one or more of the above-described disadvantages are eliminated.

According to an aspect of the present invention, there is provided an electromechanical conversion element for converting an electric signal into mechanical displacement or converting mechanical displacement into an electric signal, the electromechanical conversion element including a bottom electrode in which an alumina film, a metal film, and a conductive oxide film are sequentially laminated; an electromechanical conversion film disposed on the conductive oxide film of the bottom electrode; and a top electrode disposed on the electromechanical conversion film, wherein the metal film is solid.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention. The same elements in the drawings are denoted by the same reference numerals and overlapping descriptions may be omitted. In the following description, an electromechanical conversion element according to a first embodiment is applied to a liquid droplet jetting head, although the present invention is not so limited.

Figure 1:
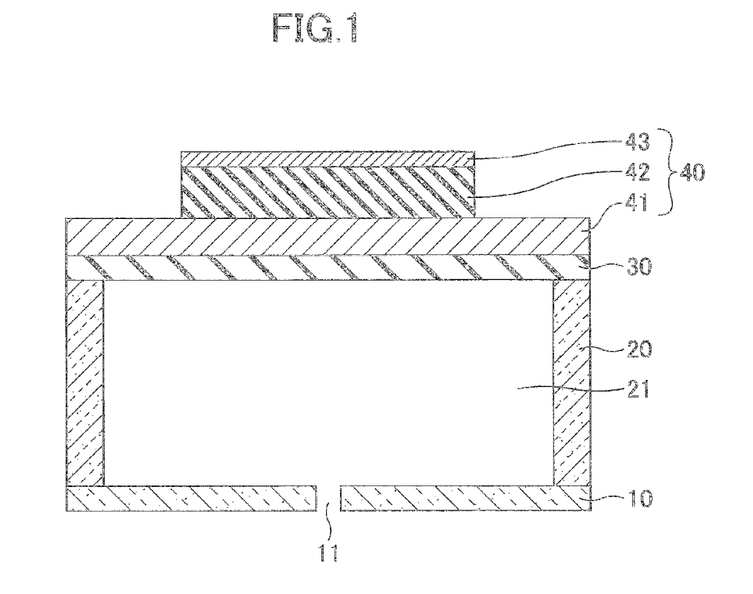
FIG. 1 is a cross-sectional view of a liquid droplet jetting head according to a first embodiment.
Figure 2:
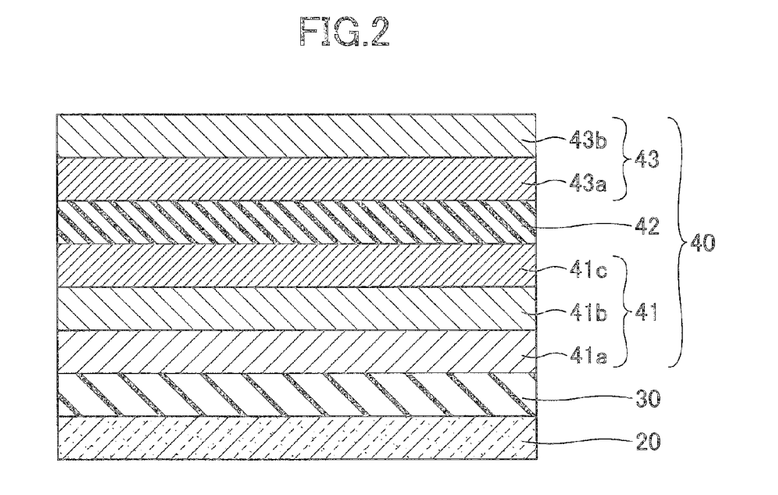
FIG. 2 is a cross-sectional view of an electromechanical conversion element according to the first embodiment.

FIG. 1 is a cross-sectional view of a liquid droplet jetting head according to a first embodiment. FIG. 2 is a cross-sectional view of an electromechanical conversion element according to the first embodiment. FIG. 2 is a detailed diagram of the configuration of an electromechanical conversion element 40 shown in FIG. 1. That is to say, in FIG. 1, the illustration of the electromechanical conversion element 40 is simplified.

Referring to FIGS. 1 and 2, a liquid droplet jetting head 1 mainly includes a nozzle plate 10, a substrate 20, a vibrating plate 30, and the electromechanical conversion element 40. In the nozzle plate 10, a nozzle 11 for jetting ink droplets is formed. A pressure chamber 21 (also referred to as an ink flow path, a pressurizing liquid chamber, a pressurizing chamber, a jetting chamber, and a liquid chamber) connecting to the nozzle 11 is formed by the nozzle plate 10, the substrate 20, and the vibrating plate 30. The vibrating plate 30 forms part of a wall of the pressure chamber 21.

The electromechanical conversion element 40 mainly includes a bottom electrode 41, an electromechanical conversion film 42, and a top electrode 43. The electromechanical conversion element 40 converts an electric signal into mechanical displacement or converts mechanical displacement into an electric signal. The electromechanical conversion element 40 is mounted at a position overlapping the pressure chamber 21 in a planar view on the vibrating plate 30 formed on one side of the substrate 20.

The liquid droplet letting head 1 jets ink liquid droplets from the nozzle 11 when the electromechanical conversion element 40 is driven. Specifically, the liquid droplet jetting head 1 has a function of supplying power to the bottom electrode 41 and the top electrode 43 to generate stress in the electromechanical conversion film 42 and vibrate the vibrating plate 30, so that ink inside the pressure chamber 21 is jetted as liquid droplets from the nozzle 11 according to the vibration of the vibrating plate 30. An ink supplying unit for supplying ink inside the pressure chamber 21, the ink flow path, and a fluid resistance are not shown or described.

In the following, a detailed description is given of the respective elements of the liquid droplet jetting head 1. In the liquid droplet jetting head 1, for example, a silicon single-crystal substrate is used as the substrate 20. The thickness of the substrate 20 is, for example, approximately 100 μm through 650 μm. When a silicon single-crystal substrate is used as the substrate 20, the pressure chamber 21 may be formed by, for example, processing the silicon single-crystal substrate by an etching method such as anisotropic etching.

The vibrating plate 30 has a function of receiving the force generated by the electromechanical conversion element 40 so that the vibrating plate 30 is deformed/displaced, and jetting ink droplets stored inside the pressure chamber 21. As a voltage is applied to the electromechanical conversion element 40, the electromechanical conversion element 40 bends and vibrates, and the vibrating plate 30 is displaced in the direction in which the electromechanical conversion element 40 is bent. The electromechanical conversion element 40 and the vibrating plate 30 on which the electromechanical conversion element 40 is mounted may be collectively referred to as a piezoelectric type actuator.

The vibrating plate 30 preferably has a predetermined strength. As materials of the vibrating plate 30, for example, Si, $SiO_2$, and $Si_3N_4$ may be used. A material having a linear expansion coefficient close to that of the bottom electrode 41 and the top electrode 43 is preferably selected.

As described below, as the material of the electromechanical conversion film 42, there are cases where lead zirconate titanate (PZT) is used. Therefore, as the vibrating plate 30, a material having a linear expansion coefficient of approximately $5 \times 10^{-6}$ through $10 \times 10^{-6}$, which is close to the linear expansion coefficient $8 \times 10^{-6}$ (1/K) of PZT, is preferably used. A material having a linear expansion coefficient of approximately $7 \times 10^{-6}$ through $9 \times 10^{-6}$ is even more preferably used.

Examples of materials of the vibrating plate 30 having a linear expansion coefficient close to that of PZT are, for example, aluminum oxide, zirconium oxide, iridium oxide, ruthenium oxide, tantalum oxide, hafnium oxide, osmium oxide, rhenium oxide, rhodium oxide, palladium oxide, and compounds thereof. The vibrating plate 30 made with these materials can be formed with a spin coater by performing a sputtering method or a sol-gel method.

The thickness of the vibrating plate 30 is preferably 0.1 μm through 10 μm, and more preferably 0.5 μm through 3 μm. If the vibrating plate 30 is thinner than this range, it is difficult to process the pressure chamber 21, and if the vibrating plate 30 is thicker than this range, it is difficult for the vibrating plate 30 to be deformed/displaced, and jetting of ink droplets becomes unstable.

The bottom electrode 41 of the electromechanical conversion element 40 includes an alumina film 41a, a metal film 41b, and a conductive oxide film 41c. The thickness of the bottom electrode 41 (total thickness of the alumina film 41a, the metal film 41b, and the conductive oxide film 41c) may be, for example, approximately 50 nm through 400 nm.

The alumina film 41a is formed on the vibrating plate 30. The thickness of the alumina film 41a may be, for example, approximately 5 nm through 50 nm. The alumina film 41a may be formed by, for example, an ALD (Atomic Layer Deposition) method. The alumina film 41a may also be formed by a sputtering method, a vacuum vapor deposition method, and a CVD (Chemical Vapor Deposition) method. The alumina film 41a functions as an adhesion layer for adhering together the vibrating plate 30 and the metal film 41b.

The metal film 41b is formed on the alumina film 41a. The metal film 41b may be made of a material such as platinum-group metal including platinum (Pt), ruthenium (Pu), rhodium (Rh), palladium (Pd), osmium (Os), and iridium (Ir), and an alloy including such a platinum-group metal. The thickness of the metal film 41b may be, for example, approximately less than or equal to 250 nm. The metal film 41b may be formed by a sputtering method and a vacuum vapor deposition method. As described below in the practical examples, the metal film 41b is a film without any holes (solid).

When PZT is selected as the electromechanical conversion film 42, the electromechanical conversion film 42 preferably has a (111) orientation as the crystallinity. Thus, as the material of the metal film 41b, platinum (Pt) having a high (111) orientation property is preferably selected, to place importance on the crystalline orientation property.

Platinum (Pt) has a face-centered cubic (FCC) lattice structure that is a close packing structure, and thus has high self-orientation. Accordingly, when amorphous material such as $SiO_2$ is used as the vibrating plate 30, and a film is formed on the amorphous material, the film will be strongly oriented to (111), and the electromechanical conversion film 42 on the platinum film will have a good orientation property.

The conductive oxide film 41c is formed on the metal film 91b. When oxygen deficiency occurs in the electromechanical conversion film 42 over time, the conductive oxide film 41c has a function of replenishing the oxygen components that have become deficient. As described in the following examples, the average particle diameter in the horizontal direction in the conductive oxide film 41c is larger than that in the metal film 41b.

As the material of the conductive oxide film 41c, for example, materials described by Srx(A)(1−x)Ruy(B) (1−y), A=Ba, Ca, B=Co, Ni, x, y=0~0.5 may be used.

Specifically, as the material of the conductive oxide film 41c, for example, $IrO_2$, $LaNiO_3$, $RuO_2$, SrO, $SrRuO_3$, and $CaRuO_3$ may be used. The thickness of the conductive oxide film 41c may be, for example, approximately 40 nm through 150 nm. The conductive oxide film 41c may be formed by, for example, a sputtering method.

As the material of the conductive oxide film 41c, when strontium ruthenate ($SrRuO_3$) having a perovskite structure is used, the quality of the $SrRuO_3$ film changes according to sputtering conditions. For example, when platinum is used as the metal film 41b and the platinum film is oriented to (111), in order to make the $SrRuO_3$ film become oriented to (111) like the platinum film to place importance on the crystalline orientation property, the $SrRuO_3$ film is preferably formed by being heated at a film-forming temperature of greater than or equal to 450° C. and less than or equal to 600° C.

The $SrRuO_3$ film may be formed at room temperature, and subsequently be subjected to thermal oxidation at a crystallization temperature (approximately 650° C.) by an RTA process (rapid thermal annealing process). In this case, the $SrRuO_3$ film is sufficiently crystallized, and a sufficient level of specific resistance as an electrode can be achieved. However, as for the crystalline orientation property of the $SrRuO_3$ film, (110) tends to be preferentially oriented, and the PXT film formed on the $SrRuO_3$ film tends to be oriented to (110).

The platinum film and the $SrRuO_3$ film are made of materials having matching lattice constants. That is to say, platinum and $SrRuO_3$ have a close lattice constant. Therefore, the 2θ positions of the $SrRuO_3$ film (111) and the platinum film (111) overlap, and it is difficult to determine the crystalline orientation by a regular θ-2θ measurement. In the platinum film, according to the extinction law, when 2θ is tilted by Psi=35°, the diffraction lines cancel out each other at the position approximately near 32°, and therefore diffraction intensity cannot be attained at this position. Thus, by tilting the Psi direction by approximately 35° and making a determination by a peak intensity where 2θ is approximately near 32°, it can be determined whether the $SrRuO_3$ film is preferentially oriented to (111).

As the material of the electromechanical conversion film 42 of the electromechanical conversion element 40, for example, PZT may be used. FZT is a solid solution of lead zirconate ($PbZrO_3$) and lead titanate ($PbTiO_3$). For example, it is possible to use a PZT in which the ratio of $PbZrO_3$ and $PbTiO_3$ is 52:48, which is expressed by a chemical formula of $Pb(Zr_{0.52}, Ti_{0.48})O_3$, and generally expressed as PZT(52/48). However, the composition of PZT is not limited to the above. An oxide including lead, zirconium, and titanium as constituting elements may be used at various ratios, or an additive may be mixed or an element may be replaced by an additive.

As other materials of the electromechanical conversion film 42, perovskite oxide indicated by a general expression $ABO_3$ (A includes Pb, and B includes Zr and titanium) is preferably used, such as lead niobium titanium zirconium oxide (PZTN) using Nb. Furthermore, from the viewpoint of the environment, $BaTiO_3$ not using Pb (barium titanate BT), a composite oxide of barium, strontium, and titanium (BST), and a composite oxide of strontium, bismuth, and tantalum (SET) may be used.

The electromechanical conversion film 42 may be formed by using, for example, a spin coating method (sol-gel method) of a sol-gel liquid. When PZT is used as the material of the electromechanical conversion film 42, first, a liquid solution formed by dissolving an organic metal compound including Pb, Zr, and Ti in a solvent is applied on top of the bottom electrode 41. Subsequently, by performing a firing process for solidifying the applied liquid solution and then a firing process for crystallizing the applied liquid solution, the electromechanical conversion film 42 is formed.

The top electrode 43 of the electromechanical conversion element 40 includes a conductive oxide film 43a and a metal film 43b. The thickness of the top electrode 43 (total thickness of the conductive oxide film 43a and the metal film 43b) may be, for example, approximately 50 nm through 300 nm.

The conductive oxide film 43a is formed on the electromechanical conversion film 42. The material of the conductive oxide film 43a may be, for example, the same as that used for the conductive oxide film 41c. The thickness of the conductive oxide film 43a may be, for example, approximately 40 nm through 150 nm. The conductive oxide film 43a may be formed by, for example, a sputtering method.

The metal film 43b is formed on the conductive oxide film 43a. The material of the metal film 43b may be, for example, the same as that used for the metal film 41b. The thickness of the metal film 43b may be, for example, approximately less than or equal to 250 nm. The metal film 43b may be formed by, for example, a sputtering method or a vacuum vapor deposition method.

Unlike the bottom electrode 41, the top electrode 43 does not undergo a high-temperature process as in the case of forming the electromechanical conversion film 42, and the top electrode 43 does not need to have a lattice constant matching that of the electromechanical conversion film 42. Thus, the materials of the metal film 43b and the conductive oxide film 43a constituting the top electrode 43 may be selected from a wider variety of materials compared to the case of the bottom electrode 41. Similar to the conductive oxide film 41c, when oxygen deficiency occurs in the electromechanical conversion film 42 over time, the conductive oxide film 43a has a function of replenishing the oxygen components that have become deficient.

In order to attain the electromechanical conversion element 40 that is processed into a predetermined shape, for example, after forming the top electrode 43, a mask layer used when etching is formed by patterning with photo-sensitive resist on the top electrode 43, and then dry etching or wet etching is performed. The patterning of the photo-sensitive resist may be performed by a known photolithography technology.

The photo-sensitive resist is applied on the top electrode 43 with a spin coater or a roll coater. Then, this is exposed to ultraviolet rays by using a glass photo-mask in which a predetermined pattern is formed. Subsequently, pattern developing→wet cleaning→drying are performed to form a photo-sensitive resist mask layer. The tilt of the edge part of the pattern of the formed photo-sensitive resist mask layer affects the tilted cross-sectional surface when performing etching. Therefore, a desired tilt angle is to be selected in consideration of the resist selection ratio (the ratio of etching rate of the etched material and the mask material). The photo-sensitive resist remaining on the etched film may be removed by using an exclusive-use stripping agent or by oxygen plasma ashing.

As the etching method, a dry etching method using reactant gas is frequently selected in consideration of the stability of the shape. As the etching gas, a halogen series gas such as chlorinated gas and fluorinated gas, or a gas formed by mixing Ar and oxygen in halogen series gas may be used. By changing the etching gas or the etching conditions, the top electrode 43 and the electromechanical conversion film 42 may be continuously etched, and the resist pattern can be formed once again and the etching procedure may be divided into several processes.

The above procedure may be performed by processing (etching) the electromechanical conversion film 42 into a predetermined shape before forming the top electrode 43, and then forming the top electrode 43 only on the electromechanical conversion film 42 having the predetermined shape.

As described above, in the electromechanical conversion element 40, by providing the alumina film 41a functioning as an adhesion layer between the vibrating plate 30 and the metal film 41b, it is possible to prevent holes from being formed in the metal film 41b and on the surface of the metal film 41b after forming the conductive oxide film 41c. That is to say, the metal film 41b has a dense pillar structure without any holes (solid). Accordingly, the lead (Pb) in the electromechanical conversion film 42 does not excessively diffuse in the metal film 41b. Therefore, a leakage path is prevented from being formed and electric field concentration is reduced, and the withstand voltage of the electromechanical conversion element 40 can be increased. Furthermore, the outage probability of the liquid droplet speed is mitigated.

Furthermore, because there are no holes in the metal film 41b (solid), the continuity of the conductive oxide crystal is not hampered by holes, and the average particle diameter in the horizontal direction in the conductive oxide film 41c can be made larger than the conventional technology (where titanium is used as the adhesion layer). Furthermore, the surface roughness of the conductive oxide film 41c can be mitigated. Accordingly, the crystallinity of the conductive oxide film 41c is improved, and therefore the quality of the electromechanical conversion film 42 formed immediately above the conductive oxide film 41c is improved, and properties of the electromechanical conversion element 40 are further improved.

Furthermore, by using the alumina film 41a as the adhesion layer, the metal film 41b is prevented from being affected by hydrogen and water from the vibrating plate 30, and therefore the crystallinity of the metal film 41b can be stabilized and improved. Thus, the properties of the electromechanical conversion element 40 are further improved, the ink jetting properties can be maintained at a preferable level, and the liquid droplet jetting head 1 can be made to have stable ink jetting properties even after continuously jetting ink.

Furthermore, when a titanium film is used as the adhesion layer, there are holes in the metal film formed on the titanium film, and therefore lead components in PZT constituting the electromechanical conversion film are excessively trapped in the holes. Thus, in a sol-gel liquid forming the PZT film, it has been necessary to set the amount of lead components to be approximately 20 mol % more than the amount required in terms of stoichiometry. In the present embodiment, this kind of problem can be avoided because there are no holes (solid) in the metal film 41b.

Second Embodiment

Figure 3:
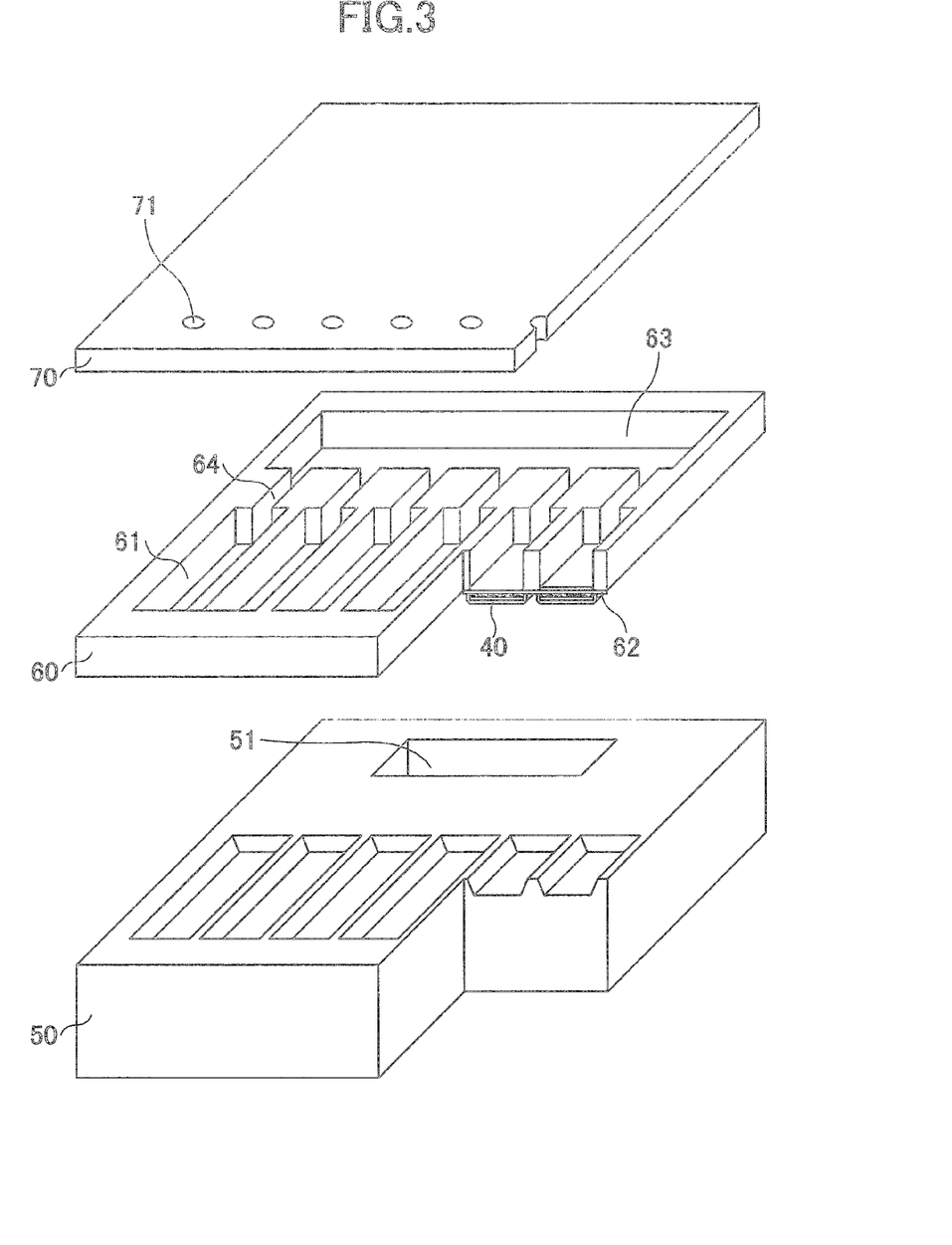
FIG. 3 is an exploded perspective view of a liquid droplet jetting head according to a second embodiment.

In a second embodiment, a liquid droplet jetting head having plural electromechanical conversion elements is indicated. FIG. 3 is an exploded perspective view of a liquid droplet jetting head according to the second embodiment. Referring to FIG. 3, a liquid droplet jetting head 2 mainly includes a first substrate 50, a second substrate 60, and a nozzle plate 70.

The first substrate 50 is a protection substrate for protecting the electromechanical conversion element of the second substrate 60, and includes a liquid supply path 51 for supplying ink liquid. The first substrate 50 is preferably made of a material having a thermal expansion coefficient that is not largely different from that of the second substrate 60. For example, the first substrate 50 is formed by using a glass substrate. For example, the liquid supply path 51 is formed by sand-blasting; however, the liquid supply path 51 may be formed by laser processing, or may be formed by machine processing or etching processing according to the material of the substrate.

The second substrate 60 is made of, for example, a silicon single-crystal substrate, and is a flow-path-forming substrate in which a flow path for ink liquid is formed. Furthermore, the second substrate 60 includes plural pressure chambers 61 functioning as a space part in which ink liquid is accommodated, plural electromechanical conversion elements 40 formed at parts corresponding to the pressure chambers 61, a flexible substrate 62 in which a driving circuit (not shown) for driving the electromechanical conversion elements 40 is formed, a common liquid chamber 63 formed at a part corresponding to the liquid supply path 51, and plural connection paths 64 connecting the pressure chambers 61 and the common liquid chamber 63. The second substrate 60 and the first substrate 50 are adhered by, for example, an adhesive of the epoxy system or the polyimide system.

The nozzle plate 70 includes plural nozzle holes 71 for jetting ink liquid droplets. The nozzle plate 70 is formed by, for example, using stainless steel having a thickness of approximately 30 μm, forming the nozzle holes 71 by press processing, and then applying resin of the fluorine system as a lyophobic film by vapor deposition on the surface on the liquid outlet side of the nozzle plate 70. As the nozzle plate 70, for example, glass ceramics and a silicon single-crystal substrate may be used. The nozzle plate 70 and the second substrate 60 are adhered by, for example, an adhesive of the epoxy system or the polyimide system.

In the liquid droplet jetting head 2, the electromechanical conversion elements 40 are driven by a driving circuit to separately jet liquid droplets from each of the nozzle holes 71.

As described above, a plurality of the electromechanical conversion elements 40 described in the first embodiment are used to realize the liquid droplet jetting head 2 capable of separately jetting liquid droplets from each of the nozzle holes 71. With the liquid droplet jetting head 2, the same effects as the first embodiment can be achieved.

Third Embodiment

Figure 4:
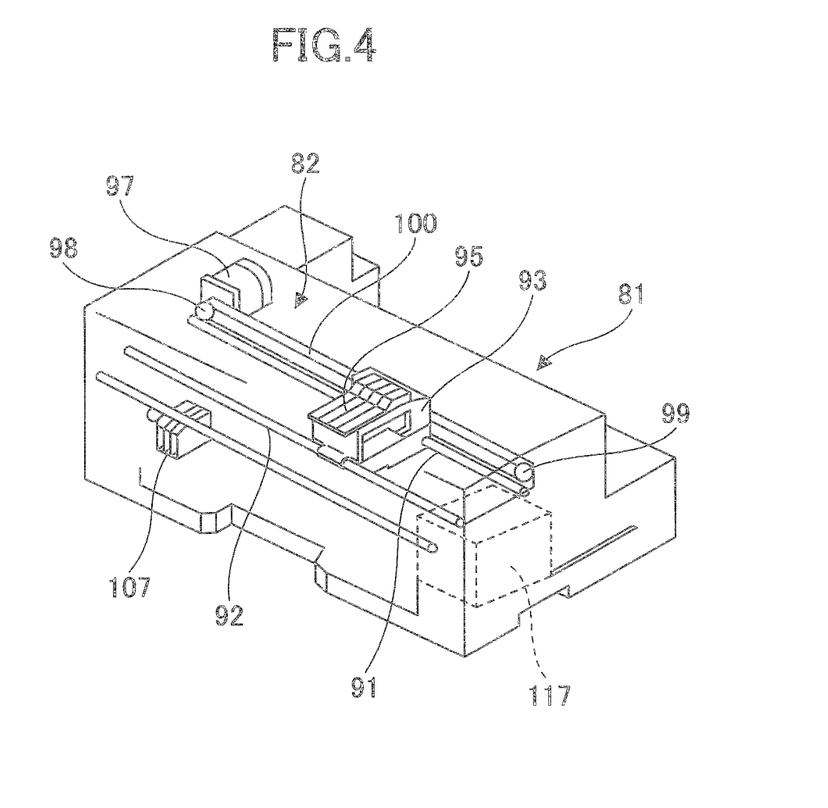
FIG. 4 is a perspective view of an inkjet recording apparatus.
Figure 5:
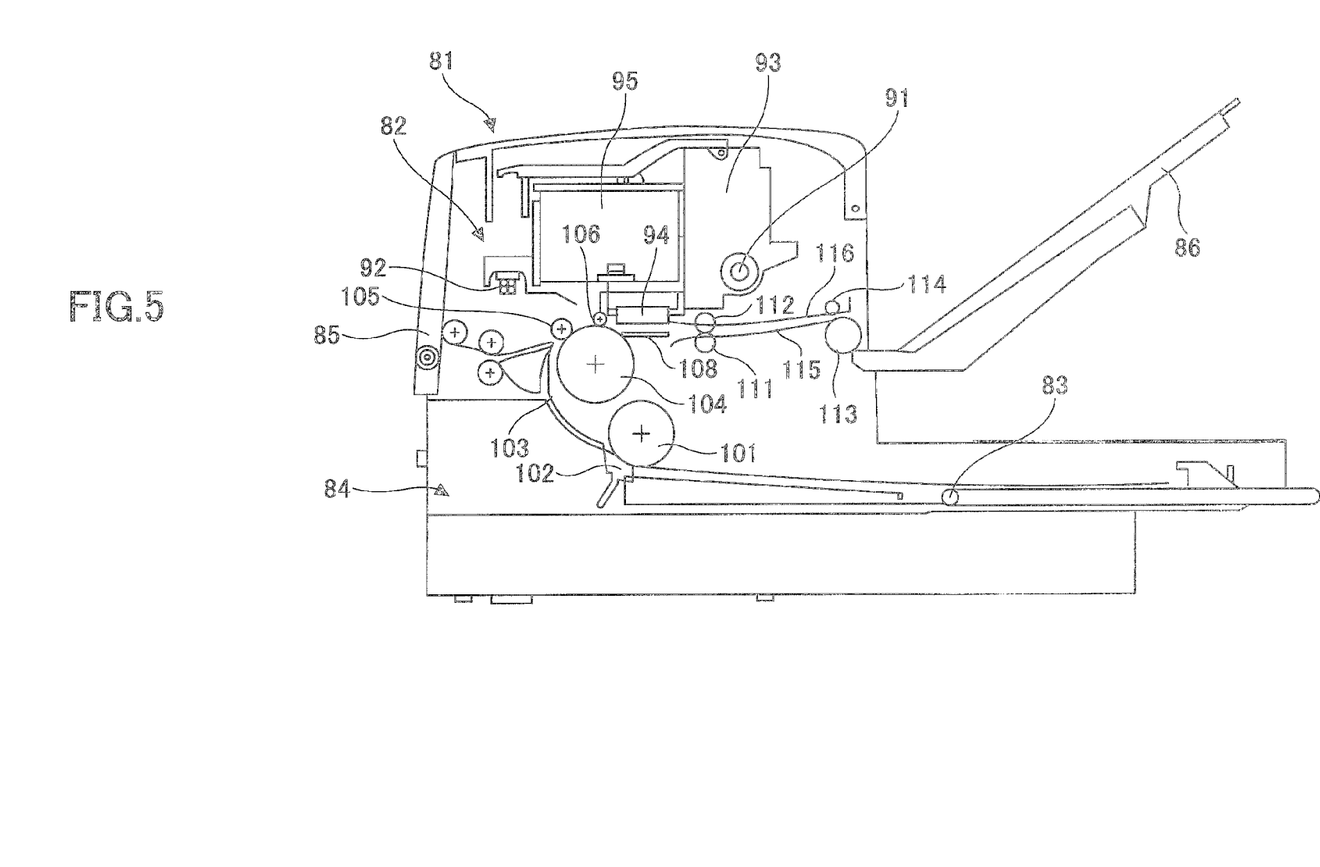
FIG. 5 is a side view of a mechanism part of the inkjet recording apparatus.

A third embodiment indicates an inkjet recording apparatus provided with the liquid droplet jetting head 2 (see FIG. 3). FIG. 4 is a perspective view of an inkjet recording apparatus. FIG. 5 is a side view of a mechanism part of the inkjet recording apparatus.

Referring to FIGS. 4 and 5, an inkjet recording apparatus 3 has a printing mechanism part 82 including a carriage 93 movable in a main scanning direction provided in a recording apparatus main unit 81, an inkjet recording head 94 that is one embodiment of the liquid droplet jetting head 2 mounted on the carriage 93, and ink cartridges 95 for supplying ink to the inkjet recording head 94.

At the bottom part of the recording apparatus main unit 81, a sheet feeding cassette 84 (or a sheet feeding tray) may be removably attached, and used for stacking multiple sheets 83. A manual feed tray 85 may be opened for manually feeding the sheets 83. The sheet 83 fed from the sheet feeding cassette 84 or the manual feed tray 85 is taken in, a desired image is recorded on the sheet 83 by the printing mechanism part 82, and the sheet 83 is ejected to a sheet eject tray 86 attached to the back side of the inkjet recording apparatus 3.

The printing mechanism part 82 holds the carriage 93 to be slidable in the main scanning direction, with a master guide rod 91 and a subordinate guide rod 92 that are guide members horizontally bridged between left and right side plates (not shown). The carriage 93 includes the inkjet recording head 94 for jetting ink droplets of the respective colors of yellow (Y), cyan (C), magenta (M), and black (Bk). Plural ink jetting outlets (nozzles) of the inkjet recording head 94 are arranged in a direction intersecting the main scanning direction, and are attached so that the ink droplet jetting direction is downward. Furthermore, in the carriage 93, a plurality of the ink cartridges 95 are replaceably attached for supplying ink of the respective colors to the inkjet recording head 94.

The ink cartridge 95 has an atmospheric opening (not shown) at the top for connecting to the atmosphere, a supply opening (not shown) at the bottom for supplying ink to the inkjet recording head 94, and a porous body (not shown) the inside of which is filled with ink. According to the capillary force of the porous body, the ink supplied to the inkjet recording head 94 is maintained to have a slight negative pressure. Furthermore, as the inkjet recording head 94, heads of the respective colors are used in this example; however, there may be only a single head having nozzles for jetting ink droplets of the respective colors.

The carriage 93 has a downstream side in the sheet conveying direction that is slidably fit to the master guide rod 91, and an upstream side in the sheet conveying direction that is slidably fit to the subordinate guide rod 92. In order to move this carriage 93 in the main scanning direction, a timing belt 100 is stretched across a drive pulley 98, which is rotated by a main scanning motor 97, and subordinate pulley 99, and the carriage 93 is driven in a reciprocating manner by the forward and reverse rotation of the main scanning motor 97. The timing belt 100 is fixed to the carriage 93.

Furthermore, the inkjet recording apparatus 3 includes a sheet feeding roller 101 for separating and supplying the sheet 83 from the sheet feeding cassette 84, a friction pad 102, a guide member 103 for guiding the sheet 83, a conveying roller 104 for reversing and conveying the sheet 83 that has been fed, a conveying roller 105 pressed against the peripheral surface of the conveying roller 104, and a leading edge roller 106 for defining the angle at which the sheet 83 is sent out from the conveying roller 104. Accordingly, the sheet 83 that is set in the sheet feeding cassette 84 is conveyed below the inkjet recording head 94. The conveying roller 104 is rotated via a gear train by a sub scanning motor 107.

A print receiving member 108 that is a sheet guiding member guides the sheet 83 below the inkjet recording head 94, which sheet 83 has been sent out from the conveying roller 104 in accordance with the movement range in the main scanning direction of the carriage 93. At the downstream side of the print receiving member 108 in the sheet conveying direction, a conveying roller 111 and a spur 112 are provided, which are rotated for sending out the sheet 83 in the sheet eject direction. Furthermore, a sheet eject roller 113 and a spur 114 for sending out the sheet 83 to the sheet eject tray 86, and guide members 115 and 116 for forming a sheet eject path, are arranged.

When recording an image, the inkjet recording head 94 is driven according to image signals while moving the carriage 93. The inkjet recording head 94 jets ink onto a stopped sheet 83 to record one line, and then the sheet 83 is conveyed by a predetermined amount and the next line is recorded. When a record end signal or a signal indicating that the trailing edge of the sheet 83 has arrived at the recording area is received, the recording operation is ended and the sheet 83 is ejected.

At a position outside the recording area on the right edge side in the moving direction of the carriage 93, there is provided a recovery device 117 for recovering from jetting failures of the inkjet recording head 94. The recovery device 117 includes a capping unit, a suction unit, and a cleaning unit. The carriage 93 is moved to the side of the recovery device 117 in a print standby state and the inkjet recording head 94 is capped by the capping unit, so that the jetting outlet parts are maintained in a moist state to prevent jetting failures caused by drying of the ink. Furthermore, during the recording operation, by jetting ink that is unrelated to the recording, the ink viscosity of all jetting outlets is maintained at a fixed level and stable jetting performance is maintained.

When a jetting failure occurs, the jetting outlets of the inkjet recording head 94 are sealed by the capping unit, and ink and air bubbles are suctioned from the jetting outlets with the suction unit through tubes. Furthermore, the ink and dust adhering to the jetting outlet surface are removed by the cleaning unit and the jetting failure is recovered from. Furthermore, the suctioned ink is discharged to a waste ink reservoir (not shown) provided below the main unit, and is suctioned/held by an ink suction body inside the waste ink reservoir.

As described above, the inkjet recording apparatus 3 is provided with the inkjet recording head 94 that is one embodiment of the liquid droplet jetting head 2. Therefore, according to the alumina film 41a functioning as an adhesion layer in the liquid droplet jetting head 2, the vibrating plate 30 and the metal film 41b are prevented from peeling off from each other. Consequently, ink droplet jetting failures caused by vibrating plate driving failures are prevented, and stable ink droplet jetting properties are attained, so that the image quality is improved.

Practical Example 1

In practical example 1, by the following procedures, the vibrating plate 30 was formed on the substrate 20, the electromechanical conversion element 40 was formed on the vibrating plate 30, and the liquid droplet jetting head 1 illustrated in FIG. 1 was formed. However, the processing of the pressure chamber 21 and the adhesion of the nozzle plate 10 were not performed.

The vibrating plate 30 can be formed by forming a single-layer film or a laminated-layer film made of oxide or nitride on the substrate 20, by LPCVD (Low Pressure CVD), plasma CVD, sputtering, and thermal oxidation. The vibrating plate 30 is often simply formed by performing thermal oxidation on the substrate 20 made of silicon. However, when the vibrating plate 30 is used in a piezoelectric type actuator, particularly in an inkjet head, the vibrating plate 30 is formed in consideration of the required strength and vibrating properties. Specifically, a $SiO_2$ thermally-oxidized film, a $SiO_2$ film, a laminated-layer film made of a silicon film and a SiN film, a $ZrO_2$ film, and a laminated-layer film made of a $SiO_2$ film and a $ZrO_2$ film are used. The total thickness of the film is approximately several μm. This laminated-layer film is used as the vibrating plate 30.

In practical example 1, a $SiO_2$ film and a laminated-layer film made of a silicon film and a SiN film (thickness of 2 μm) were formed as the vibrating plate 30 on the substrate 20 made of silicon by a thermal processing film forming method and a LPCVD method. Next, the bottom electrode 41 was formed on the vibrating plate 30. Specifically, first, the alumina film 41a (thickness 50 nm) was formed on the vibrating plate 30 by an ALD method. Then, a platinum film (thickness 125 nm) was formed as the metal film 41b on the alumina film 41a by sputtering. Furthermore, a $SrRuO_3$ film (thickness 50 nm) was formed as the conductive oxide film 41c on the metal film 41b by sputtering, and the bottom electrode 41 was completed. The substrate heating temperature was 550° C. when performing sputtering to form the $SrRuO_3$ film.

Next, in order to form the electromechanical conversion film 42 on the bottom electrode 41, a liquid solution having a composition ratio of Pb:Zr:Ti=110:53:47 was prepared. As the specific composition of the precursor applying liquid, lead acetate trihydrate, titanium isopropoxide, and zirconium isopropoxide were used as the starting materials. Crystal water of lead acetate was dissolved in methoxyethanol, and was then dehydrated. The amount of lead was larger than that of the stoichiometry composition. This is to prevent the crystallinity from degrading due to the loss of lead during the thermal process.

Titanium isopropoxide and zirconium isopropoxide were dissolved in methoxyethanol, an alcohol interchange reaction and an esterification reaction progressed, and this methoxyethanol solution was mixed with the methoxyethanol solution obtained by dissolving lead acetate described above, to form the PZT precursor solution. The PZT density was set at 0.5 mol/liter. With the use of this liquid, a film of the PZT precursor was formed on the bottom electrode 41 by spin coating. After forming the film, the film was dried at 120° C., and a thermal decomposition process was performed at 500° C.

After performing the thermal decomposition process on three layers, an RTA process (rapid thermal annealing process) was performed as the crystallization thermal process (at a temperature of 750° C.) on the PZT precursor. The thickness of the PZT was 240 nm. This procedure was repeated for a total of eight times (24 layers), and a PZT film of approximately 2 μm was achieved as the electromechanical conversion film 42.

Next, the top electrode 43 was formed on the electromechanical conversion film 42. Specifically, first, a $SrRuO_3$ film (thickness of 40 nm) was formed by sputtering as the conductive oxide film 43a on the electromechanical conversion film 42. The substrate temperature was 300° C. during sputtering. Subsequently, as an RTA process, a post annealing process was performed in an oxygen atmosphere at 550° C./300 s. Subsequently, a platinum film (thickness 60 nm) was formed by sputtering on the metal film 43b, and the top electrode 43 was completed.

Subsequently, a film of photoresist (TSMR8800) manufactured by Tokyo Ohka Kogyo Co., Ltd. was formed by spin coating, a resist pattern was formed by a regular photolithography method, and then an ICP etching device s used to process (pattern) the electromechanical conversion element 40 into a predetermined shape.

Next, on the cross-sectional surface of the electromechanical conversion element 40 (respective cross-sectional surfaces of the bottom electrode 41, the electromechanical conversion film 42, and the top electrode 43) that has been processed into a predetermined shape, a protection layer constituted by an oxide layer of $Al_2C_3$ was formed by a process of an ALD method. The protection layer is disposed for the purpose of blocking the cross-sectional surface of the electromechanical conversion element 40 from elements in the driving atmosphere such as moisture. The thickness of the protection layer is preferably approximately 30 nm through 100 nm.

Next, an inter-layer insulating layer was formed on the electromechanical conversion element 40. The inter-layer insulating layer is used as an insulating layer for contact between wiring electrodes laminated on the electromechanical conversion element 40, and the bottom electrode 41 and the top electrode 43 of the electromechanical conversion element 40. As the material of the inter-layer insulating layer, oxide, nitride, or a mixture thereof may be used, and the thickness of the inter-layer insulating layer is preferably approximately 300 nm through 700 nm.

After forming the inter-layer insulating layer, a through hole was formed for contact between the wiring electrodes laminated on the electromechanical conversion element 40, and the bottom electrode 41 and the top electrode 43 of the electromechanical conversion element 40. The through hole was formed by using photolithography and then performing etching. The remaining resist was removed by oxygen plasma ashing.

The wiring electrode layer is used for retrieving individual electrodes and a common electrode of the electromechanical conversion element 40, and therefore the wiring electrode layer is formed by selecting a material with which ohmic contact can be made with the materials of the bottom electrode 41 and the top electrode 43. Specifically, the wiring electrode layer was made of a wiring material obtained by including several atomic % of a hillock growth inhibiting component such as Si, in pure Al or Al.

For the wiring electrode layer, from the viewpoint of conductivity, a wiring material for a semiconductor including Cu as the main component may be used. The thickness of the wiring electrode layer is set to have a wiring resistance that does not hamper the driving of the electromechanical conversion element 40, also considering the resistance caused by the layout distance of the wiring. Specifically, in the case of an Al system wiring, the thickness of the wiring electrode layer is approximately 1 μm.

As described above, the wiring electrode layer is formed into a desired shape by using a photolithography technology. The remaining resist is removed by oxygen plasma aching. The wiring electrode layer is preferably covered by a protection layer made of oxide or nitride except for portions required for electrical connection, for the purpose of ensuring resistance against the environment. As described above, the liquid droplet jetting head 1 is completed, excluding the processing of the pressure chamber 21 and the adhesion of the nozzle plate 10.

Comparative Example 1

In the comparative example 1, a titanium film was formed as the adhesion layer by sputtering, instead of the alumina film 41a. Otherwise, a liquid droplet jetting head including an electromechanical conversion element was formed in the same manner as practical example 1.

As for the electromechanical conversion elements formed in practical example 1 and comparative example 1, in the processing procedure immediately after a platinum film was formed as the metal film 41b, NanoScope IIIa AFM manufactured by Nihon Veeco K.K. was used to evaluate the particle diameter in the horizontal direction in the platinum film. Similarly, immediately after forming the $SrRuO_3$ film as the conductive oxide film 41c, the particle diameter in the horizontal direction in the $SrRuO_3$ film was evaluated. In the AFM measurement, the measurement mode was a tapping mode, the measurement range was 3 μm×3 μm, and the scanning speed was 1 Hz. Table 1 shows the detailed results of the measurement.

TABLE 1

|  | Film configuration measured by AFM | Particle diameter [μm] |
| --- | --- | --- |
| Practical example 1 | Pt/$Al_2O_3$<br>$SrRuO_3$/Pt/$Al_2O_3$ | 100 through 150<br>120 through 200 |
| Comparative example 1 | Pt/Ti<br>$SrRuO_3$/Pt/Ti | 70 through 80<br>70 through 80 |

As shown in Table 1, compared to the case of using a titanium film as the adhesion layer (comparative example 1), in the case of using an alumina film as the adhesion layer (practical example 1), the average particle diameter in the horizontal direction was larger, both in the platinum film formed as the metal film 41b and the SrRuO₃ film formed as the conductive oxide film 41c. That is to say, the crystallinity of both the metal film 41b and the conductive oxide film 41c was improved.

Furthermore, in practical example 1 and comparative example 1, the cross-sectional surface was observed by SEM immediately after forming the SrRuO₃ film as the conductive oxide film 41c. Furthermore, by FIB processing, the SrRuO₃ film was cut in the thickness direction, and was observed by SEM. When observing the cross-sectional surface in the thickness direction for confirming holes, the SEM magnification ratio was greater than or equal to 100 k times. The SEM image of practical example 1 is shown in FIG. 6, and the SEM image of comparative example 1 is shown in FIG. 7.

Figure 6:
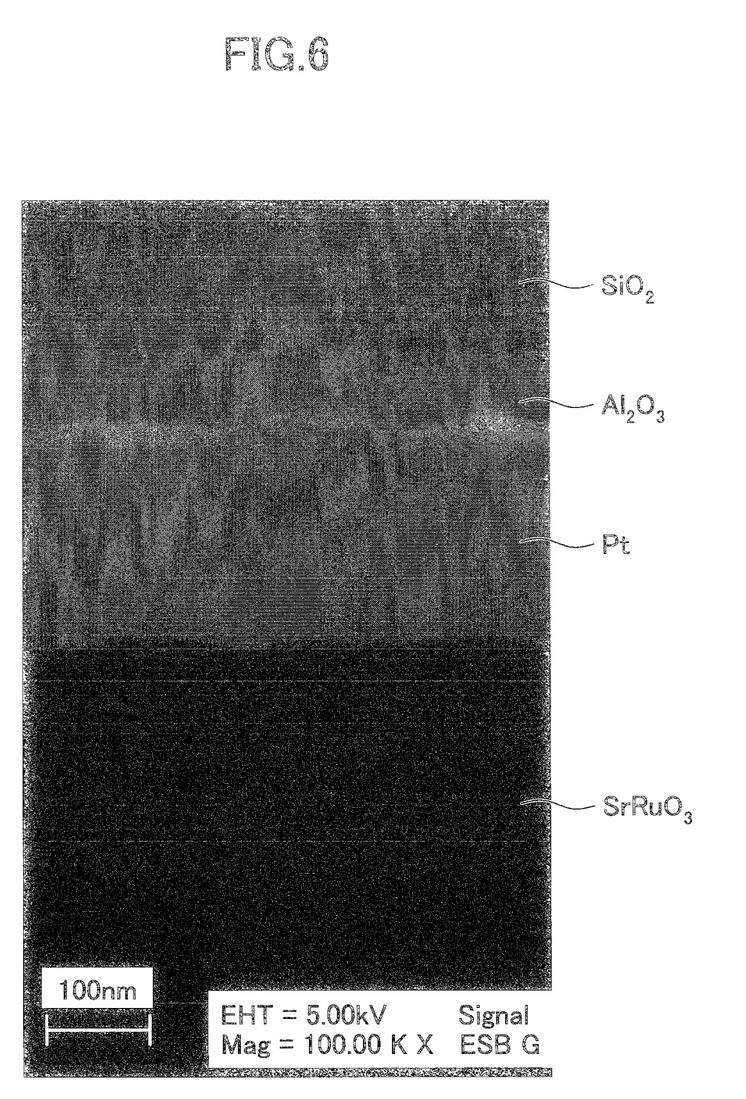
FIG. 6 is a SEM image of a cross-sectional surface of a film formed according to practical example 1.
Figure 7:
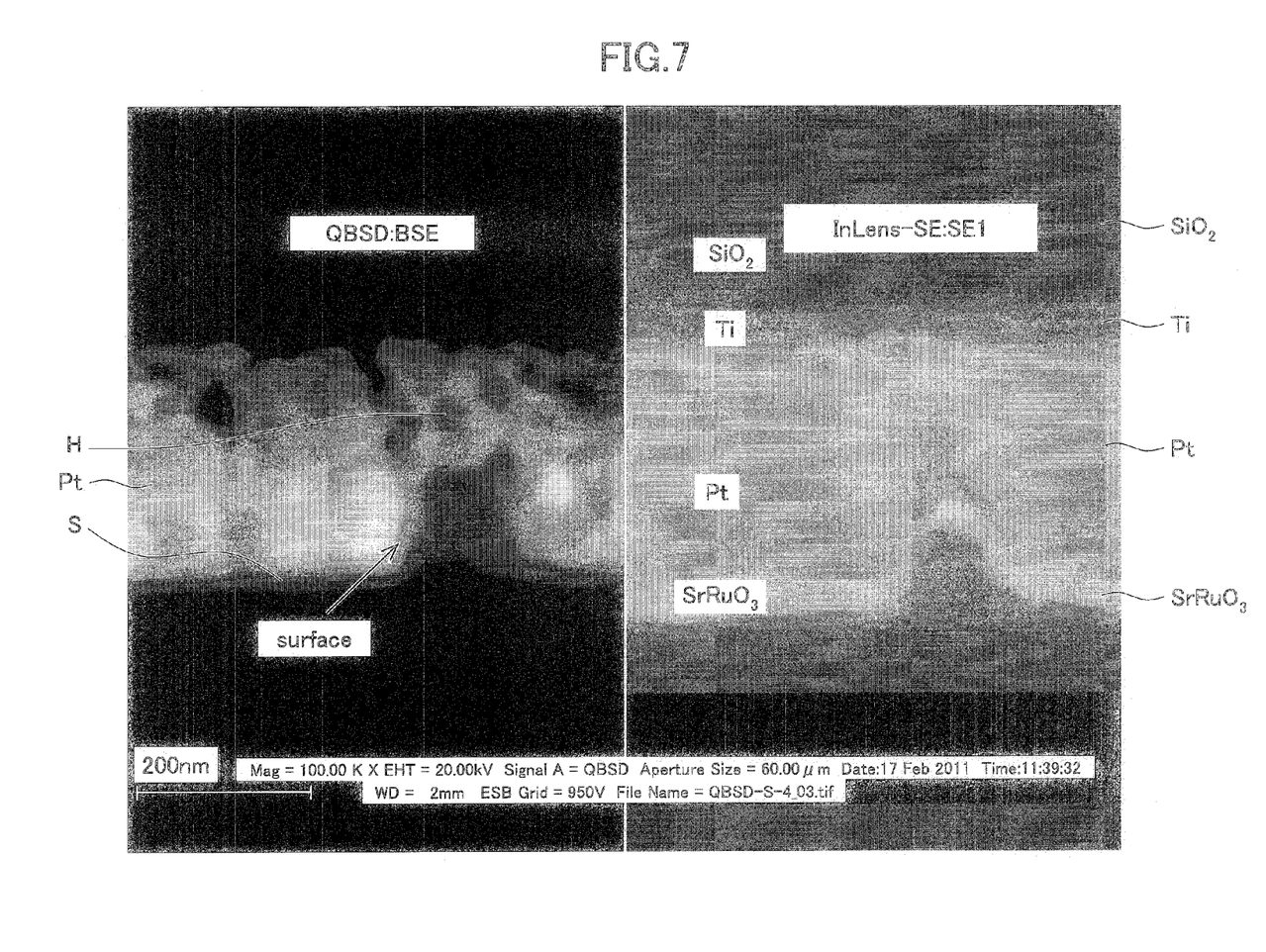
FIG. 7 is a SEM image of a cross-sectional surface of a film formed according to comparative example 1.

As shown in FIG. 6, in practical example 1, no holes were observed in the platinum film formed as the metal film 41b. Meanwhile, as shown in FIG. 7, in comparative example 1, many holes H were confirmed in the platinum film formed as the metal film 41b; furthermore, there were also many holes H confirmed on the surface S of the SrRuO₃ film formed as the conductive oxide film 41c. In practical example 1, even after the electromechanical conversion element 40 was completed, no holes were observed in the platinum film formed as the metal film 41b.

Next, the deformation amount by applying an electric field (150 kV/cm) was measured with a laser doppler vibration meter, and properties of the piezoelectric body were calculated based on calibration by simulation. After evaluating the initial properties, the durability (properties immediately after repeatedly applying a voltage $10^{10}$ times) was evaluated. Table 2 shows the detailed results of the evaluation.

that is the same as the crystal orientation plane constituting the SrRuO₃ film was oriented to the highest degree.

Accordingly, in practical example 1, there is a small number of grain boundary parts in the electromechanical conversion film 42, and a difference in composition hardly arises between the inside of the electromechanical conversion film 42 and near the boundary face of the SrRuO₃ film. Accordingly, the initial polarization amount is large, and the polarization amount hardly decreases even after performing switching plural times (repeatedly applying a voltage). Furthermore, the withstand voltage is high, the leakage current is low, and irregularities on the surface of the electromechanical conversion film 42 can be minimized. Thus, the electromechanical conversion film 42 having good fatigue properties and good electric properties with fewer irregularities on the surface, can be realized.

Practical Example 2

In practical example 2, the liquid droplet jetting head 1 shown in FIG. 1 was formed. That is to say, in addition to the substrate 20 made of silicon of practical example 1, the pressure chamber 21 was processed and adhesion of the nozzle plate 10 was performed. The pressure chamber 21 was formed with the use of the photolithography technology, by deeply digging the bottom side of the substrate 20 up to the vibrating plate 30 by ICP (Inductively Coupled Plasma) etching.

Subsequently, the nozzle plate 10, a driving circuit (not shown), and an ink liquid supply mechanism not shown) were assembled, and the liquid droplet jetting head 1 including the electromechanical conversion element 40 was completed.

TABLE 2

| | | 2Pr [µC/cm²] | | d31 [pm/V] | | OUTAGE |
| --- | --- | --- | --- | --- | --- | --- |
| | WITHSTAND VOLTAGE [V] | INITIAL | AFTER APPLYING VOLTAGE $10^{10}$ TIMES | INITIAL | AFTER APPLYING VOLTAGE $10^{10}$ TIMES | PROBABILITY [%] OF LIQUID DROPLET SPEED |
| PRACTICAL EXAMPLE 1 | 224 | 51 | 49 | −160 | −158 | 1.8 |
| COMPARATIVE EXAMPLE 1 | 111 | 44 | 36 | −152 | −136 | 10.2 |

As shown in Table 2, the withstand voltage for practical example 1 was approximately two times as high as that of comparative example 1. Furthermore, in practical example 1, the initial properties and the results after the durability test were both the same as the properties of a general ceramic sintered body (residual polarization approximately Pr:25 µC/cm², piezoelectric constant approximately d31:−160 µm/V). Meanwhile, in comparative example 1, the initial properties show sufficient values; however, the properties after $10^{10}$ times (after repeatedly applying a voltage $10^{10}$ times), it was confirmed that both the residual polarization Pr and the piezoelectric constant d31 had deteriorated.

This is probably because the average particle diameter in the horizontal direction in the SrRuO₃ film formed as the conductive oxide film 41c was larger in the case of practical example 1 than in the case of comparative example 1. That is to say, in practical example 1, because the average particle diameter in the horizontal direction in the SrRuO₃ film is large, the lattice constant matches that of the electromechanical conversion film 42 formed immediately above the conductive oxide film 41c, and it is considered that the electromechanical conversion film 42 was formed such that a plane Also with this liquid droplet jetting head 1 having a structure including the pressure chamber 21, good properties similar to those of practical example 1 were achieved.

According to an embodiment of the present invention, an electromechanical conversion element is provided, by which the withstand voltage can be increased.

The electromechanical conversion element, the manufacturing method thereof, the piezoelectric type actuator, the liquid droplet jetting head, and the inkjet recording apparatus are not limited to the specific embodiments described herein, and variations and modifications may be made without departing from the scope of the present invention.

The present application is based on Japanese priority Patent Application No. 2012-060545, filed on Mar. 23, 2012, the entire contents of which are hereby incorporated herein by reference.

What is claimed is:
1. An electromechanical conversion element for converting an electric signal into mechanical displacement or converting mechanical displacement into an electric signal, the electromechanical conversion element comprising:

a bottom electrode in which an alumina film, a metal film, and a conductive oxide film are sequentially laminated;

an electromechanical conversion film disposed on the conductive oxide film of the bottom electrode; and a top electrode disposed on the electromechanical conversion film.

2. The electromechanical conversion element according to claim 1, wherein the conductive oxide film is made of a material having a lattice constant that matches a lattice constant of the metal film, and an average particle diameter in a horizontal direction in the conductive oxide film is larger than an average particle diameter in a horizontal direction in the metal film.

3. The electromechanical conversion element according to claim 1, wherein the metal film is a platinum film, and the conductive oxide film is a strontium ruthenate film.

4. The electromechanical conversion element according to claim 3, wherein the strontium ruthenate film has a perovskite structure, and (111) is preferentially oriented in the strontium ruthenate film.

5. The electromechanical conversion element according to claim 1, wherein the metal film has a thickness of less than or equal to 250 nm.

6. A piezoelectric type actuator comprising:

the electromechanical conversion element according to claim 1; and a vibrating plate on which the electromechanical conversion element is mounted, wherein as a voltage is applied to the electromechanical conversion element, the electromechanical conversion element bends and vibrates, and the vibrating plate is displaced in a direction in which the electromechanical conversion element is bent.

7. A liquid droplet jetting head comprising:

the piezoelectric type actuator according to claim 6.

8. The liquid droplet jetting head according to claim 7, further comprising:

a substrate on which a pressure chamber is formed, wherein the vibrating plate is provided on one side of the substrate, and the electromechanical conversion element is mounted at a position overlapping the pressure chamber on the vibrating plate in a planar view.

9. An inkjet recording apparatus comprising:

the liquid droplet jetting head according to claim 7.

10. A manufacturing method of an electromechanical conversion element for converting an electric signal into mechanical displacement or converting mechanical displacement into an electric signal, the manufacturing method comprising:

forming a bottom electrode by sequentially laminating an alumina film, a metal film, and a conductive oxide film;

forming an electromechanical conversion film on the conductive oxide film of the bottom electrode; and forming a top electrode on the electromechanical conversion film, wherein the forming of the bottom electrode includes forming the conductive oxide film on the metal film by a sputtering method at a temperature of greater than or equal to 450° C. and less than or equal to 600° C.

11. The manufacturing method according to claim 10, wherein the forming of the electromechanical conversion film includes forming the electromechanical conversion film by a sol-gel method.

* * * * *